ELECTRONIC OSCILLATOR
Filed May 28, 1949
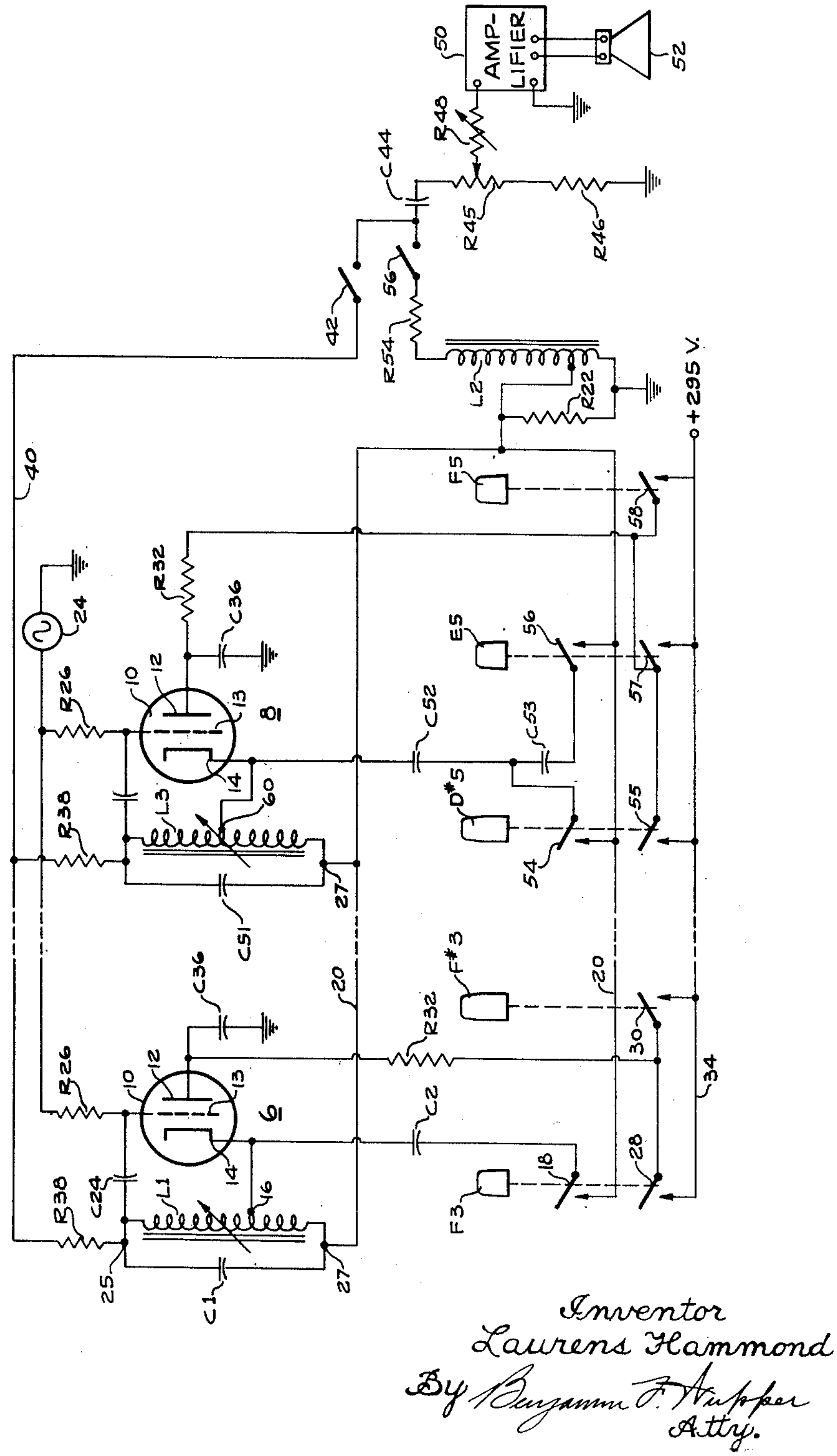
Inventor
Laurens Hammond
By Benjamin T. Wupper
Atty.

United States Patent Office 2,790,906

Patented Apr. 30, 1957

2,790,906

ELECTRONIC OSCILLATOR

Laurens Hammond, Chicago, Ill., assignor to Hammond Organ Company, a corporation of Delaware Application May 28, 1949, Serial No. 96,107

5 Claims. (Cl. 250—36)

My invention relates generally to electronic oscillators for electrical musical instruments, and more particularly to improvements in oscillators used to supply a plurality of adjacent semitone frequencies.

In electrical musical instruments of the polyphonic type, in which the tone frequencies are generated by electronic oscillators, it is desirable to reduce as greatly as possible the number of oscillators employed. This may be done in several ways, as shown for example in the patent to E. E. Coupleux et al., No. 1,905,996, wherein the resonant circuit of each of the oscillators is provided with a pair of inductance elements which may be selectively connected in the resonant circuit so as to determine the frequency of oscillation.

For economy in production, I prefer to make it possible to tune each of the oscillators to one of two or three frequencies by changing the amount of capacitance in the resonant tuning circuit. From a manufacturing point of view, this presents some difficulties since it is necessary that the oscillator oscillate accurately at each of its two or three semitone frequencies, which ordinarily would make it essential that each of the capacitors determining the frequencies of oscillation be of accurately determined value, and the probability is that no two capacitors would be of the same value.

Capacitors of the type usable in audio frequency oscillators are frequently sold with a capacitance tolerance of ±20%. At additional cost the tolerance may be reduced to ±10%, and upon special order and at greatly increased cost the tolerance may be reduced to ±5% or less. This is due to the fact that tubular capacitors cannot practically be manufactured in quantities to have exactly predetermined capacitance values. To obtain capacitors having values of the required accuracy of approximately 3 parts in a thousand would of course be difficult and extremely costly, since the manufacturer would have to select such capacitors from a lot and would have to find a market for the remaining capacitors of the lot. Probably less than 1% of the capacitors of a manufactured lot would have the desired capacitance.

Since the intervals of the successive semitone notes of the tempered musical scale differ in frequency by the 12th root of 2, that is, by the factor 1.059463, it will be understood that it would not be possible in a practical way to build a large number of oscillators using capacitors of such critical values purchased with the usual trade tolerances in capacitive variation. It is therefore a primary object of the invention to provide an improved electronic oscillator capable of selectively operating at any of two or three frequencies differing by semitone intervals in which at least two of the capacitors used for tuning the resonant circuit of the oscillator to the different semitone frequencies are of substantially equal value, and the third capacitor is not of critical value.

It will be clear that if the capacitors by which the frequency of oscillation of the oscillators is determined are of the same value, but not of critical absolute value, the manufacturer of a large number of these oscillators may make or purchase the capacitors in large lots, then accurately measure the value of each capacitor and sort the capacitors into groups in which the variation of individual capacitors is less than one part in a thousand. Then in constructing the oscillators it is merely necessary that two capacitors of the same group be selected for use in that particular oscillator. It is feasible to construct oscillators of the type mentioned, using pairs of capacitors of substantially equal values, even though of different absolute values in different oscillators, because the inductance in the tuning circuit may be varied readily by making slight changes and adjustments in the laminar field structure of the inductor.

By using this method of selecting the capacitors it becomes highly probable that the capacitors selected for the tuning circuit of a particular oscillator were made under similar conditions of the same materials and that the capacitors will vary in capacitance with age, changes in temperature and humidity etc., in the same manner and to the same extent. It is therefore highly probable that the capacitors thus selected will remain of equal capacitance at all times, even though their absolute values may change.

It is therefore a further object of my invention to provide an electronic oscillator which may readily be tuned to either one of two adjacent semitone frequencies by the use of a pair of capacitors of equal value, and by this means decrease the cost of manufacture.

It is a further object of the invention to provide an improved electronic oscillator capable of being tuned to oscillate at three different semitone frequencies, in which the tuning is effected by the use of two capacitors of equal values and a third capacitor of noncritical value.

In the accompanying drawing, the invention is illustrated diagrammatically in a combined schematic circuit and block diagram.

In the drawing two oscillators 6 and 8 are illustrated, the oscillator 6 being designed to provide either of two adjacent semitone frequencies and the oscillator 8 designed to provide any of three adjacent semitone frequencies. The oscillator 6 comprises a triode 10 having a plate or anode 12, a grid 13, and a cathode 14, and includes a resonant circuit which may comprise a variable inductance L1 having a capacitor C1 in parallel therewith. This resonant circuit may include, additionally, a capacitor C2, of the same value as C1, connected between a tap 16 on the inductance L1 and a switch 18 operated by a playing key F3. The switch 18, when closed, connects the capacitor C2 to a conductor 20. Conductor 20 is connected to ground through a low value resistor R22 and a portion of the winding of an autotransformer L2. The tap 16 is located so that approximately 65% of the turns of L1 are between tap 16 and terminal 25.

A blocking capacitor C24 connects the terminal 25 at one end of the resonant mesh L1—C1 (or L1—C1—C2) to the grid 13. The other terminal 27 of this mesh is connected to conductor 20 and is thus connected to ground through R22 and a portion of L2.

Varying bias is impressed upon the grid 13 by a suitable generator 24 which operates at a vibrato periodicity and is connected between ground and the grid 13 by resistor R26 to introduce the vibrato effect in the output of the oscillator. The oscillator 6 is normally not oscillating since it is supplied with plate current only upon the closure of either a switch 28 or a switch 30, these switches being connected to the plate 12 through a load resistor R32. Switches 28 and 30 are respectively operated by keys F3 (349.228 C. P. S.) and F#3 (369.94 C. P. S.), and are adapted to connect the load resistor R32 to a conductor 34 which leads to a suitable source of positive plate voltage indicated as a terminal +295 v. The plate 12 is connected to ground through a capacitor C36. This capacitor, together with the resistor R32, forms a time constant mesh to prevent the potential on the plate 12 from building up so rapidly as to cause transients in the output. A sine wave signal is derived from the terminal 25 of the resonant mesh through a decoupling resistor R38 which is connected by a conductor 40 to a switch 42. When the switch 42 is closed the generally sine wave signal is transmitted through a capacitor C44 to the output of the instrument, which includes a potentiometer resistor R45 in series with a load resistor R46 connected to ground. A volume control variable resistor R48 conducts the signal to an amplifier 50, the output of the amplifier being supplied to a speaker 52.

The oscillator 8 is generally similar to oscillator 6 in the circuit arrangement. Corresponding reference characters have therefore been applied to corresponding parts and a description thereof will not be repeated. Capacitors C51 and C52 of oscillator 8, which correspond to capacitors C1 and C2 of oscillator 6, do not necessarily have the same values as C1 and C2. However the value of capacitor C51 is equal to that of C52. The frequency of operation of oscillator 8 is controlled by keys D#5 (1244.507 C. P. S.), E5 (1318.510 C. P. S.) and F5 (1396.912 C. P. S.) Depression of key D#5 results in the closure of switches 54 and 55. Key E5 operates switches 56 and 57, while key F operates a single switch 58. Tap 60 on tuning inductance L3 is located so that approximately 51% of the turns of L3 are between it and terminal 27.

Closure of switch 54 connects capacitor C52 in parallel with the part of L3 between tap 60 and terminal 27, thus being in parallel with approximately 51% of the turns of L3. Closure of switch 56 connects C52 in series with a capacitor C53 across the same portion of L3. Switches 55, 57, and 58 connect the plate 12 to the plate current source +295 v. upon depression of their associated keys D#5, E5 and F5 respectively.

The conductor 20 which is connected to the terminals 27 of the oscillators receives from the oscillators signals of complex quality. The signals appearing on the conductor 20 are impressed over a portion of the autotransformer winding L2. The ungrounded terminal of L2 is adapted to be connected to capacitor C44 through resistor R54 upon closure of a manually operable switch 56. Various tone control networks may be coupled to L2 so as to modify the quality of the tones produced.

While only two oscillators are shown it will be understood that a complete instrument would include an oscillator for each group of the two or three adjacent semitones within the gamut of the instrument. If desired, the oscillators may have their outputs connected in groups to a number of conductors such as conductors 40 and 20, so as to have the tone qualities of the different groups of oscillators separately controllable.

As above described, capacitors C1 and C2 are of equal capacitance, and for the purposes of the present discussion of the theory underlying the invention it will be assumed that each has a value of unity. Since, upon closure of switch 18, C2 is connected across 35% of the turns of L1 it will have an effective capacitance, across all of the turns of L1, of $.35^2$ or .1225. Thus when switch 18 is closed the effective capacitance across L1 will be that of C1 plus that of C2, namely 1.1225. Since the frequency of oscillation of the oscillator changes by a factor which is the reciprocal of the square root of the effective capacitance in the tuning circuit, the pitch change upon closure of switch 18 will be the reciprocal of the square root of 1.1225, or 1.0 divided by 1.059481. This pitch change is in error by only 18 parts in a million, as compared with the theoretically perfect semitone interval, the twelfth root of 2, that is, 1.059463.

Thus, by using two capacitors of equal values and connecting one of them across 35% of the turns of the tuning inductance, the oscillator may readily be tuned very accurately to the pitches of either of two adjacent semitones.

Referring to oscillator 8, it will be noted that when switch 54 is closed, C52 will be connected across 51% of the turns of L3. Again assuming C51 to have a value of unity, C52, also having a value of 1.0, will have an effective value in the resonant circuit of .51 squared, or .2601. The total effective capacitance in the resonant circuit will then be that of the sum of the capacitances of C51 and C52, namely, 1.2601. The pitch change factor, resultant from the addition of C52 to the tuning circuit will be the reciprocal of the square root of 1.2601, or 1/1.122542. This factor differs from the theoretically correct factor for a full tone interval of the tempered musical scale, 1/1.122462, by only 8 parts in 100,000, which is not a perceptible error in musical pitch.

Closing switch 56 connects C52 and C53 in series across 51% of the turns of L3, and these capacitors would, if C51, C52 and C53 were of equal values, have an effective value across L3 of 1.13005 times that of C51 alone. The resultant change in pitch therefore would be in the ratio of 1/1.06304. This differs from the theoretically correct ratio by a factor of about 1/279, which is an acceptable error factor, but is a little too large to be desirable.

Computations show that if the tone produced (when key E5 is depressed and C52 and C53 are thus connected in series across 51% of L3) shall have the theoretically correct pitch, C53 should have a capacitance value of 0.89, assuming C51 and C52 each have a value of 1.0. The value of C53 could be reduced to a value of about .79 without making the error in pitch too great. It will thus be clear that the value of C53 is not critical, since even at the above mentioned values of 1 and .79 the error in pitch would be tolerable and, as the value of C53 approached more closely to 0.89, the error in pitch would decrease at a rapid rate.

From the foregoing it will appear that by connecting capacitors across predetermined percentages of the turns of an inductance element, oscillators may be made selectively to oscillate accurately at any of two or three adjacent semitone pitches without requiring any high degree of accuracy in the absolute values of the capacitors. The only requirement is that each pair of capacitors for an oscillator be very nearly of the same values, and, as above pointed out, this requirement may be met without difficulty or appreciable expense by measuring the values of a lot of capacitors and using a pair of equal capacitance for each oscillator. The final adjustment of the tuning circuit, to cause the oscillator to operate accurately at any of the two or three desired pitches, is accomplished by adjusting one or more of the laminations in the core of the inductance element and clamping the laminations and coil against further relative movement.

It will be understood that the foregoing calculations are of a theoretical character and do not take into consideration other variable factors which enter into the determination of the frequency of oscillation of an oscillator. For example, the inductances L1 and L3 have a certain amount of distributed capacitance so that they do not act as pure inductances. In addition the capacitors C36 are of relatively large value, as compared with the resistors R32, to provide proper attack time constants, and as a result, no substantial signal appears across these resistors R32, and the plates 12 of the triodes are held at a substantially constant potential. The value of the capacitors C36 therefore is another factor which enters into the determination of the frequency of oscillation of the oscillators. A further factor is the manner in which the coils for inductances L1 and L3 are wound upon their cores, that is, the "form factor" of these coils is also in part determinative of the frequency of oscillation of the oscillators. These, and other minor factors enter into the determination of the frequency of oscillation, and introduce discrepancies which must be taken into account in determining the precise positions of the taps 16 and 60.

Due to these variant factors, the location of the taps 16 and 60, instead of being exactly at 35% and 51% of the turns of their respective inductances L1 and L3, may be located, for example, at 37 or 38% (instead of 35%) and 54 or 55% (instead of 51%).

In general, it may be stated that it will be found that the percentage positions of the taps 16 and 60 will be found to be somewhat greater than the 35% and 51% values arrived at by the foregoing theoretical calculations. These calculations would be truly representative of acual conditions only if there were no components of the oscillator, other than the inductances and capacitors, which had an effect upon the frequency of oscillation. Since the factors other than the capacitance of the capacitors and the values of the inductances used may vary considerably, it will be understood that the locations of the taps 16 and 60 on the inductances L1 and L3 are best determined by taking into consideration these other factors. As a practical matter the location of the taps can be determined by initially locating the taps at about 37% of the turns of L1, and at about 54% of the turns of L3, and then shifting the taps a few turns until the oscillators oscillate at the desired frequencies. Thus, compensation may be made for variations in the values of other circuit elements and variations in the particular design of the oscillator.

As illustrating the possible variations from the calculated values in particular oscillators which have been constructed, the oscillators shown in the drawings of this application were found to operate in a stable manner at the desired frequencies when their components had the following values:

| | |
|---|---|
| L1 | 2.2 henrys, tapped at 37.2% of the turns. |
| L3 | .29 henrys, tapped at 54.4% of the turns. |
| C1 and C2 | .086 microfarad. |
| C24 | .001 microfarad. |
| C36 | .05 microfarad. |
| C51 and C52 | .0463 microfarad. |
| C53 | .0412 microfarad. |
| R26 | 2.2 megohms. |
| R32 | 56,000 ohms. |
| R38 | 1.5 megohms. |

It will be understood that these values are merely illustrative and that wide deviations from these values are possible, especially if compensatory changes are made in the values of other components.

The oscillator per se (as differentiated from the means by which it may be tuned to one of several semitones) is not claimed herein but is claimed in the copending application of John M. Hanert, Serial No. 224,276, filed May 3, 1951.

While I have shown and described preferred embodiments of my invention, it will be apparent that numerous variations and modifications thereof may be made without departing from the underlying principles of the invention. I therefore desire, by the following claims, to include within the scope of the invention all such variations and modifications by which substantially the results of my invention may be obtained through the use of substantially the same or equivalent means.

I claim:

1. An oscillator for selectively generating one of two adjacent semitone frequencies, comprising an electron discharge device, a resonant circuit coupled to the device for determining its frequency of oscillation, said resonant circuit including an inductance element having an adjustable core and a coil having a large number of turns, said coil having a top intermediate its ends and located at a point so that approximately thirty-five percent of the turns will lie between the tap and one of the ends of the coil a pair of fixed capacitors of substantially equal value, means connecting one of the capacitors in parallel with the inductance element, and selectively operable means for connecting the other capacitor between the tap and that end of the coil which will cause the capacitor to be in parallel with approximately thirty-five percent of the turns of the inductance element.

2. An oscillator for selectively generating any one of three consecutive semitone frequencies, comprising an electron discharge device, a resonant circuit coupled to the device for determining its frequency of oscillation, said resonant circuit including an inductance element having a large number of turns, a first capacitor connected in parallel with the inductance element, a second capacitor having a capacitance the same as that of the first capacitor within three parts in one thousand, selectively operated means for connecting the second capacitor in parallel with substantially fifty-one percent of the turns of the inductance element, a third capacitor having a capacitance between eighty and one hundred percent of the capacitance of the first capacitor, and selectively operated means for connecting the second and third capacitors in series across substantially fifty-one percent of the turns of the inductance element.

3. An oscillator for selectively generating any one of three adjacent semitone frequencies, comprising an electron discharge device, a resonant tuning circuit associated with the device for determining its frequency of oscillation, said resonant circuit including a tapped inductance element having a large number of turns, the tap being at a point such that substantially fifty-one percent of the turns lie between it and one end terminal of the inductance element, three capacitors, the first and second capacitors being of values equal within approximately three parts in one thousand, and the third capacitor having a value substantially equal to or as much as twenty percent less than that of the first capacitor, means connecting the first capacitor in parallel with the inductance element, selectively operable means for connecting the second capacitor between the tap on the inductance element and the said end terminal thereof, and selectively operable means for connecting the third capacitor in series with the second capacitor between the tap on the inductance element and the said end terminal thereof.

4. An oscillator for selectively generating any one of three consecutive semitone frequencies, comprising an electron discharge device, a resonant circuit coupled to the device for determining its frequency of oscillation, said resonant circuit including an inductance element having a large number of turns, a first capacitor permanently connected in parallel with the inductance element, the values of the inductance element and the first capacitor being such as to tune the oscillator to the highest of the three semitone frequencies, a second capacitor having a capacitance substantially the same as that of the first capacitor, a first selectively operated means for connecting the second capacitor in parallel with a sufficient number of the turns of the inductance element to tune the oscillator to the lowest of the three semitone frequencies, a third capacitor, and a second selectively operated means for connecting the second and third capacitors in series across the same number of the turns of the inductance element that the second capacitor is connected by the first selectively operated means, the value of the third capacitor being such that when the second selectively operated means is operated, the oscillator will be tuned to the intermediate semitone frequency.

5. An oscillator for selectively generating one of two adjacent semitone frequencies, comprising an electron discharge device having electrodes, a resonant frequency determining circuit coupled to at least two of said electrodes comprising an inductance element having first and second end terminals and an intermediate tap located such that there will be substantially thirty-five percent of the turns of its coil between the tap and the second terminal thereof, a first fixed capacitor connected between the end terminals of the inductance element, a second fixed capacitor having the same capacitance as the first capacitor, and a manually operable switch and conductors for connecting the second capacitor between said tap and said second end terminal.

References Cited in the file of this patent

UNITED STATES PATENTS

| | | |
|---|---|---|
| 1,961,253 | Schrenk | June 5, 1934 |
| 1,992,805 | Becker | Feb. 26, 1935 |
| 2,061,740 | Rechnitzer | Nov. 24, 1936 |
| 2,061,818 | Weyers | Nov. 24, 1936 |
| 2,088,034 | Rinia | July 27, 1937 |
| 2,278,066 | Domack et al. | Mar. 31, 1942 |
| 2,531,312 | Van Loon | Nov. 21, 1950 |
| 2,570,701 | Martin | Oct. 9, 1951 |